(12) United States Patent
Koizumi et al.

(10) Patent No.: US 6,847,026 B2
(45) Date of Patent: Jan. 25, 2005

(54) SOLID IMAGE PICK-UP APPARATUS

(75) Inventors: Toru Koizumi, Kanagawa (JP); Katsuhito Sakurai, Tokyo (JP); Hiroki Hiyama, Kanagawa (JP); Masaru Fujimura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 147 days.

(21) Appl. No.: 10/350,095

(22) Filed: Jan. 24, 2003

(65) Prior Publication Data

US 2003/0141436 A1 Jul. 31, 2003

(30) Foreign Application Priority Data

Jan. 29, 2002 (JP) ........................................ 2002-020216

(51) Int. Cl.[7] .............................................. H01L 27/00
(52) U.S. Cl. ..................... 250/208.1; 348/294; 348/317
(58) Field of Search ....................... 250/208.1; 348/294, 348/317, 320, 322

(56) References Cited

U.S. PATENT DOCUMENTS 4,996,413 A * 2/1991 McDaniel et al. ....... 250/208.1
5,631,704 A * 5/1997 Dickinson et al. .......... 348/308
6,646,249 B2 * 11/2003 Bird ........................ 250/208.1
6,741,283 B1 * 5/2004 Merrill et al. .............. 348/308

FOREIGN PATENT DOCUMENTS

JP          2-268063        11/1990

* cited by examiner

Primary Examiner—Stephone B. Allen
Assistant Examiner—Patrick J. Lee
(74) Attorney, Agent, or Firm—Fitzpatrick, Cella, Harper & Scinto

(57) ABSTRACT

A solid image pick-up apparatus having a plurality of sensor cells each of the sensor cells having a photoelectric converting device, includes a plurality of holding capacitances for holding signals from the plurality of sensor cells, a plurality of first switches for transferring signals of the plurality of holding capacitances, a plurality of blocking areas for connecting outputs of the plurality of first switches each blocking area connecting the outputs of a predetermined number of at least two of the first switches, a common signal line, and a plurality of second switches for transferring signals of the plurality of blocking areas to the common signal line.

15 Claims, 16 Drawing Sheets

SOLID IMAGE PICK-UP APPARATUS

BACKGROUND OF THE INVENTION

1. Field of the Invention

The present invention relates to a solid image pick-up apparatus, a camera and an information processing apparatus having the solid image pick-up apparatus.

2. Description of the Related Art

General-solid image pick-up apparatuses, e.g., a line sensor and an area sensor, have a large number of sensor cells including photoelectric converting devices with a line alignment or two-dimensional alignment. Outputs from the sensor cells are temporarily held by holding capacitances and thereafter are distributed onto a common signal line via a transistor switch. Thus, a potential on the common signal line is changed, it amplified by an amplifier and then outputted.

The common signal line has not only a wiring capacitance as a parasitic capacitance but also a parasitic capacitance corresponding to a drain capacitance of the number of the transistor switches corresponding to the number of line sensors in the line direction because the number of the transistors for the switch corresponding to the number of sensor cells in the line direction is connected to the common signal line.

The increase in parasitic capacitance of the common signal line reduces potential change of the common signal line upon distributing charges held in the holding capacitance to the common signal line. In recent years, the increase in number of pixels and in size of the solid image pick-up apparatuses has advanced and, in accordance therewith, the increase in the number of the transistor switches (in the total source capacitance) and the increase in wiring capacitances allow the parasitic capacitance of the common signal line to become higher.

A photoelectrically converting apparatus to solve the above-mentioned problems is disclosed in Japanese Unexamined Patent Application Publication No. 2-268063. FIG. 1 is a diagram showing the structure of the above-mentioned photoelectrically converting apparatus. Referring to FIG. 1, the photoelectrically converting apparatus comprises two photoelectrically converting devices S1 and S2 and a single MOS transistor TH1 corresponding thereto. Therefore, the total number of MOS transistors connected to a common output signal line SL is half of the number of columns and thus a parasitic capacitance of the common output signal line SL is reduced. The photoelectric converting devices S1 and S2 are connected to a signal line H1 via MOS transistors Ts1 and Ts2. Outputs from the photoelectrically converting devices S1 and S2 charge to capacitors C1 and C2 commonly connected to the signal line H1, and are sequentially distributed onto the output signal line SL via the MOS transistor TH1.

However, in the above-mentioned conventional photoelectrically converting device, the capacitors C1 and C2 having holding capacitances are commonly connected to the signal line H1. Thus, although the parasitic capacitance of the output signal line SL is reduced, the parasitic capacitance of the signal line H1 is increased. Such a disadvantage exerts little undesirable-influence on the operation of the device when the number of capacitors commonly connected to the signal line H1 is decreased. It becomes more serious, however, as the number of capacitors commonly connected to the signal line H1 is increased. This means that, unpreferably, there is an increase in load to be driven by the photoelectrically converting devices S1 and S2. A positional relationship between the capacitor C1 and the photoelectrically converting device S1 cannot be similar to that between the capacitor C2 and the photoelectrically converting device S2. Consequently, a route for reading the signal from the photoelectric converting device S1 cannot match a route for reading the signal from the photoelectric converting device S2.

SUMMARY OF THE INVENTION

Accordingly, it is an object of the present invention to reduce a parasitic capacitance of a common signal line.

In order to solve the above-mentioned object, according to an aspect of the present invention, there is provided a solid image pick-up apparatus having a plurality of sensor cells each of the sensor cells having a photoelectric converting device, comprising: a plurality of holding capacitances for holding signals from the plurality of sensor cells; a plurality of first switches for transferring signals from the plurality of holding capacitances; a plurality of blocking areas for connecting outputs of the plurality of first switches each blocking area connecting the outputs of a predetermined number of at least two of the first switches; a common signal line; and a plurality of second switches for transferring signals from the plurality of blocking areas to the common signal line.

Further objects, features and advantages of the present invention will become apparent from the following description of the preferred embodiments with reference to the attached drawings.

DESCRIPTION OF THE PREFERRED EMBODIMENTS

Hereinbelow, a solid image pick-up apparatus according to embodiments of the present invention will be described with reference to the drawings. Although the solid image pick-up apparatus according to the first embodiment is applied to an area sensor, it can be applied to a line sensor.

Figure 2:
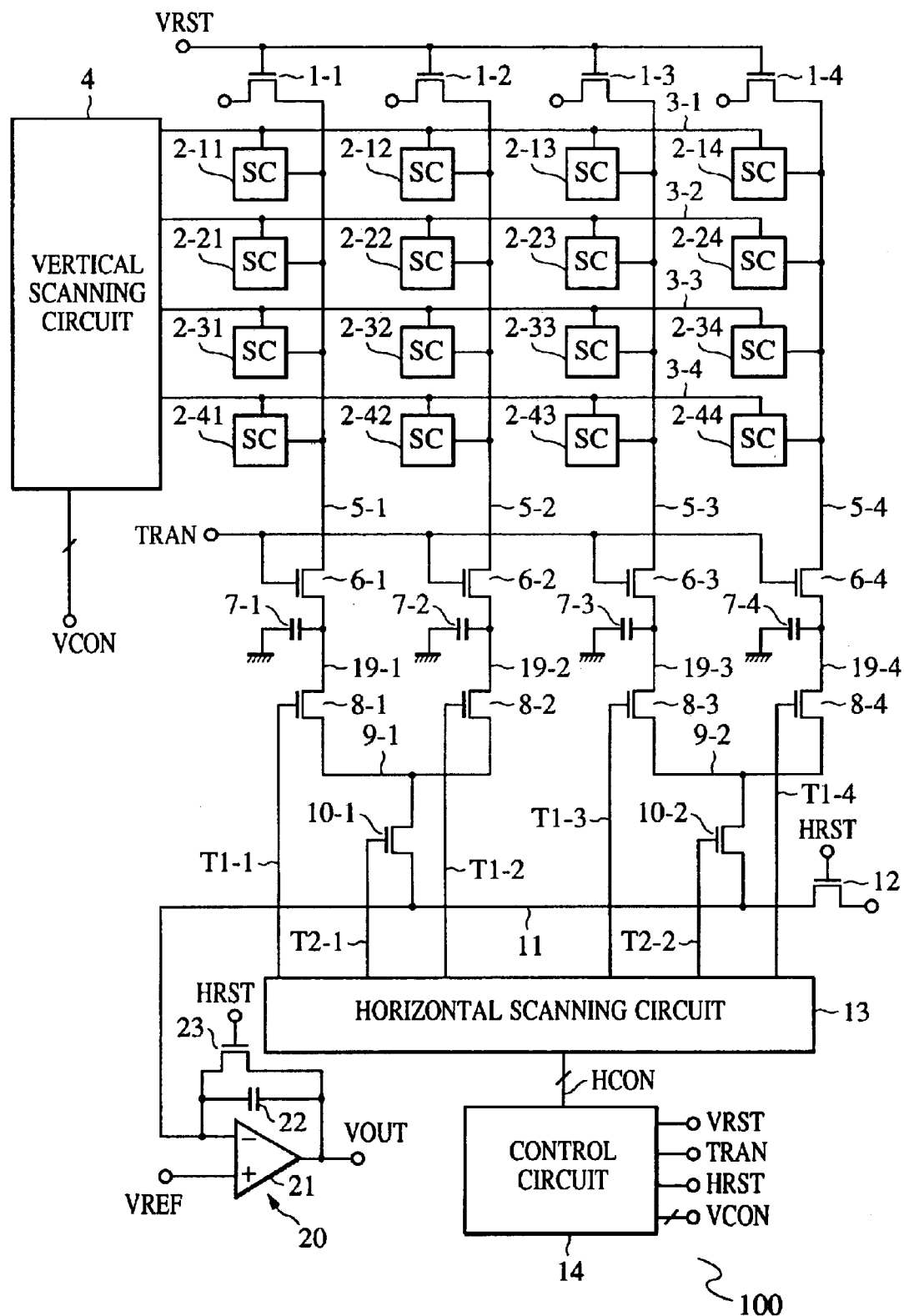
FIG. 2 is a block diagram showing the structure of a solid image pick-up apparatus according to a first embodiment of the present invention.

FIG. 2 is a diagram showing the structure of a solid image pick-up apparatus according to a first embodiment of the present invention. Herein, although the solid image pick-up apparatus having a two-dimensional alignment of four rows and four columns is used as an example, the present invention can be applied to solid image pick-up apparatuses having many number of pixels.

Figure 3:
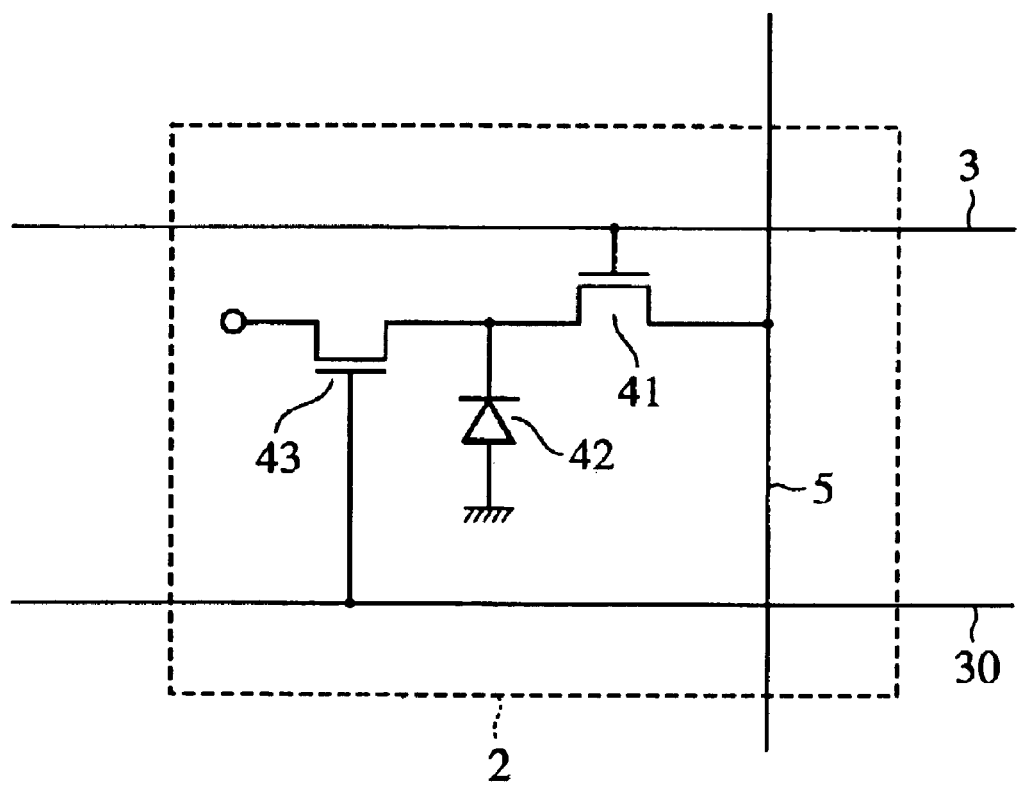
FIG. 3 is a diagram showing an example of the structure of a sensor cell.

Referring to FIG. 2, the solid image pick-up apparatus comprises sensor cells 2 (2-11 to 2-14, 2-21 to 2-24, 2-31 to 2-34, and 2-41 to 2-44) having four rows and four columns. Referring to FIG. 3, as an example, each sensor cell 2 comprises a signal transfer transistor 41, a photodiode (photoelectrically converting device) 42, and a reset transistor 43. A charge signal is generated by the photodiode 42 by light incident on the photodiode 42 and then is transferred to a vertical signal line 5 as a voltage signal via the signal transfer transistor 41. The reset transistor 43 resets the photodiode 42 in response to a reset signal 30 supplied from, e.g., a vertical scanning circuit 4 or the like.

The vertical scanning circuit 4 sets one of selecting signal lines 3 (3-1 to 3-4) to an active level (H level) and thus a row of the sensor cell 2 having the two-dimensional alignment is selected. Upon reading the signal from the sensor cells 2, the vertical scanning circuit 4 sequentially sets the four selecting signal lines 3 to the active level in response to a control signal VCON from a control circuit 14, thereby scanning pixels in the vertical direction.

Prior to operation for reading the rows (specifically, activation of the selecting signal lines 3), the vertical scanning circuit 4 sets a vertical reset signal VRST for controlling reset circuits 1 (1-1 to 1-4) comprising an MOS transistor and the like to the active level (H level) and sets a transfer signal line TRAN for controlling transfer transistors 6 (6-1 to 6-4) comprising the MOS transistor and the like to the active level (H level), thereby resetting vertical signal lines 5 (5-1 to 5-4) and holding capacitances (7-1 to 7-4).

The selecting signal line 3 (e.g., 3-1) becomes the active level and the transfer transistor 41 (refer to FIG. 3) is turned on. Consequently, the sensor cells 2 (e.g., 2-11 to 2-14) drive the vertical signal lines 5 (5-1 to 5-4) and transfer a voltage signal to the vertical signal lines 5.

The voltage signals on the vertical signal lines 5 (5-1 to 5-4) are held in the holding capacitances 7 (7-1 to 7-4) whose first ends (signal terminals) are connected to signal lines 19 (19-1 to 19-4) via the transfer transistors 6 (6-1 to 6-4). For example a ground potential is applied to second ends of the holding capacitances 7.

The charges held in the holding capacitances 7-1 and 7-2 are distributed to a horizontal signal line (blocking area) 9-1 via first switches 8-1 and 8-2 comprising the MOS transistors and the like. That is, the charges held in the holding capacitances 7-1 and 7-2 are distributed between capacitances on the signal lines 19 (19-1 and 19-2) to which the signal terminals of the holding capacitances 7-1 and 7-2 are connected and the parasitic capacitance of the blocking horizontal signal line 9-1. Thus, a potential corresponding to the holding capacitance 7-1 or 7-2 is generated on the blocking horizontal signal line 9-1. Since the charges held in the holding capacitances 7-1 and 7-2 cannot simultaneously be distributed to the blocking horizontal signal line 9-1, the first switches 8-1 and 8-2 are turned on at different timings. The parasitic capacitance of the blocking horizontal signal line 9-1 includes the wiring capacitance, source capacitances of the first switches 8-1 and 8-2, and a drain capacitance of the second switch 10-2.

Similarly, the charges held in the holding capacitances 7-3 and 7-4 are distributed on the blocking horizontal signal line (blocking area) 9-2 via first switches 8-3 and 8-4 comprising the MOS transistor and the like. That is, the charges held in the holding capacitances 7-3 and 7-4 are distributed between capacitances on the signal lines 19 (19-3 and 19-4) to which the signal terminals of the holding capacitances 7-3 and 7-4 are connected and the parasitic capacitance of the blocking horizontal signal line 9-2. Thus, a potential corresponding to the holding capacitance 7-3 or 7-4 is generated on the blocking horizontal signal line 9-2. Since the charges held in the holding capacitances 7-3 and 7-4 cannot simultaneously be distributed to the blocking horizontal signal line 9-2, the first switches 8-3 and 8-4 are turned on at different timings. The parasitic capacitance of the blocking horizontal signal line 9-2 includes the wiring capacitance, source capacitances of the first switches 8-3 and 8-4, and a drain capacitance of the second switch 10-2.

The charges on the blocking horizontal signal line 9-1 as a result of the charge distribution are further distributed on the common horizontal signal line 11 via the second switch 10-1. That is, the charges held in the holding capacitance 7-1 (or 7-2) are distributed among capacitances on the signal line 19 (19-1 or 19-2) to which the signal terminal of the holding capacitances 7-1 or 7-2 is connected, the parasitic capacitance of the blocking horizontal signal line 9-1, and the parasitic capacitance of the horizontal signal line 11 via the first switch 8-1 or 8-2 and the second switch 10-1. Thus, the potential corresponding to the charge held in the holding capacitance 7-1 or 7-2 is generated on the common horizontal signal line 11.

The charges on the blocking horizontal signal line 9-2 generated by the charge distribution are distributed onto the common horizontal signal line 11 via the second switch 10-2. That is, the charges held in the holding capacitance 7-3 or 7-4 are distributed among the capacitance on the signal line 19-3 or 19-4 to which the signal terminal of the holding capacity 7-3 or 7-4 is connected via the first switch 8-3 or 8-4 and the second switch 10-2, the parasitic capacitance of the blocking horizontal signal line 9-2, and the parasitic capacitance of the horizontal signal line 11. Thus, the potential corresponding to the charge held in the holding capacitance 7-3 or 7-4 is generated on the common horizontal signal line 11.

That is, according to the first embodiment, arrays of the sensor cell 2 having four columns (or first switch 8) are blocked by a two-column unit, and the blocking horizontal signal lines 9-1 and 9-2 of the blocks are connected to the common horizontal signal line 11 via the second switches 10-1 and 10-2, respectively. Therefore, the parasitic capacitance of the switch (transistor) on the common horizontal signal line 11 becomes the parasitic capacitances of the switches 10-1 and 10-2 corresponding to two columns as a half of the four columns. Further, the blocking into two blocks (division) reduces the parasitic capacitance of the switch on the common horizontal signal line 11 to ½.

In the example shown in FIG. 2, the sensor cell arrays having four columns (or the first switch) are divided into two blocks by a two-column unit as a simplified example. Generically, according to the principle, the sensor cell arrays (or the first switch) are blocked into n blocks (n division) by an n-column unit and then the parasitic capacitance on the common horizontal signal line 11 becomes 1/n (corresponding to no division).

Herein, it is expressed that the sensor cell arrays (or the first switch) are blocked or divided. However, according to another expression, the common horizontal signal line is divided.

The blocking or division greatly reduces the parasitic capacitance on the common horizontal signal line 11. Thus, the change in potential of the common horizontal signal line 11 becomes remarkably large upon distributing the charges held in the holding capacitance 7 to the common horizontal signal line 11. This means that a gain for reading the signal from the holding capacitance 7 is increased and an S/N ratio is improved.

According to the first embodiment, only the holding capacitance 7 (e.g., 7-1) of the corresponding column is arranged at the signal line 19 (e.g., 19-1) between the transfer switch 6 (e.g., 6-1) and the first switch 8 (e.g., 8-1). Therefore, the wiring length of the signal line 19 is reduced. The parasitic capacitance of the signal line 19 is reduced and the structure of a reading route (between the columns) can easily be similar.

Figure 1:
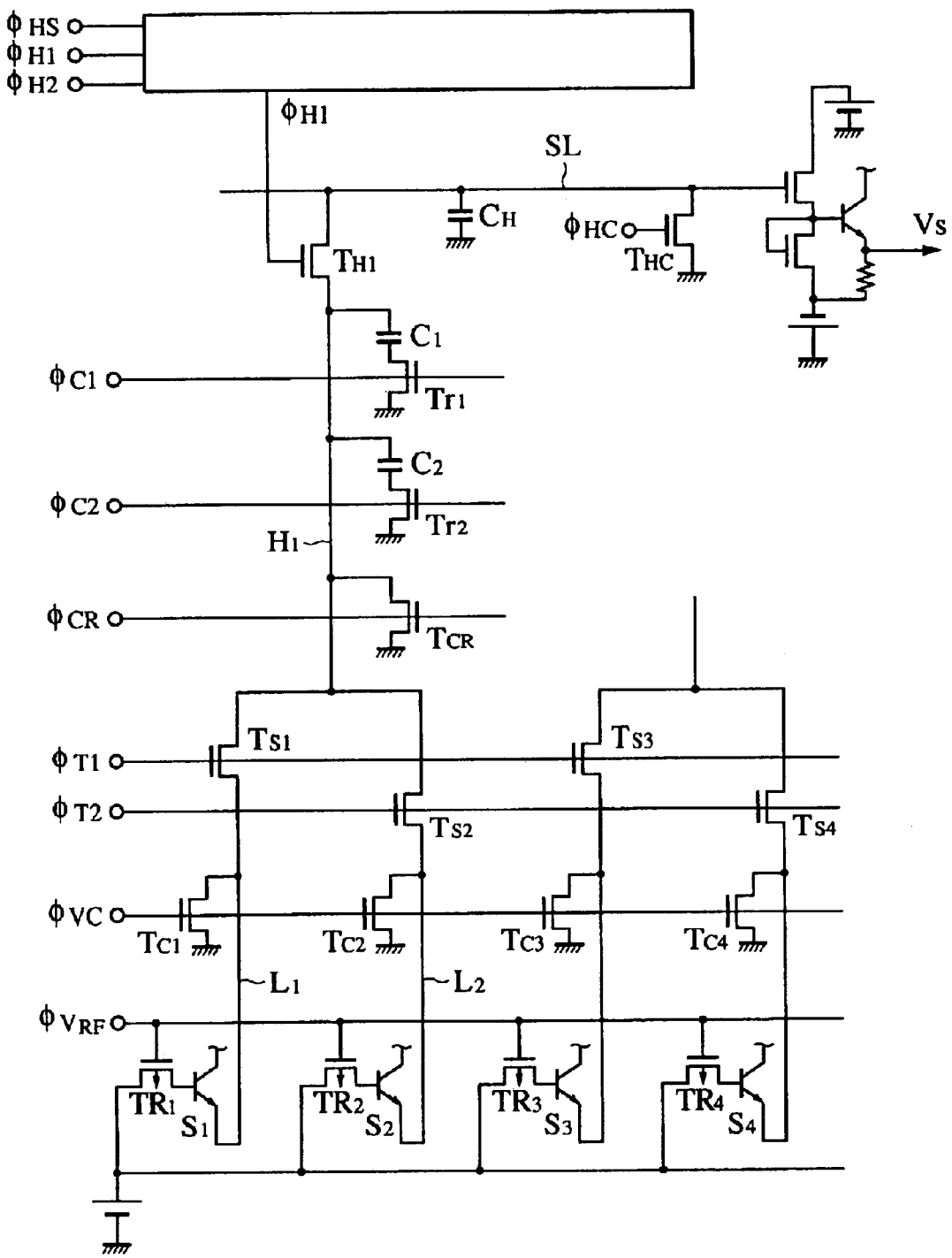
FIG. 1 is a diagram showing the structure of a conventional photoelectrically converting apparatus.

On the other hand, with the conventional structure shown in FIG. 1, when the signal line H1 in the vertical direction common to eight columns, eight capacitors must be arranged to the signal line H1, transistors (e.g., Tr1 and Tr2) must be arranged between the eight capacitors and a ground line, and further signal lines (e.g., φc1 and φc2) for controlling the capacitors and the transistors must be arranged. Then, the wiring length of the signal line H1 is long. Thus, the load to be driven by the photoelectrically converting devices (e.g., S1 and S2) is increased. Further, with the conventional structure shown in FIG. 1, the increase in number of capacitors commonly connected to the signal line H1 does not permit the structure of the reading route (columns) to be similar.

The signal on the common horizontal signal line 11 is amplified and outputted by a capacitance feed-back amplifier 20. The capacitance feed-back amplifier 20 comprises a difference amplifier 21, a feed-back capacitance 22 which is connected in parallel between an inverse input terminal (−) of the difference amplifier 21 and an output terminal VOUT, and a transistor 23 for reset which is connected in parallel to the feed-back capacitance 22. A reference voltage VREF is applied to a non-inverse input terminal (+) of the difference amplifier 21.

In place of the capacitance feed-back amplifier 20, for example, a voltage reading amplifier can be used. However, preferably, the capacitance feed-back amplifier 20 is used. The use of the capacitance feed-back amplifier 20 determines a reading gain only by the holding capacitance 7 and the feed-back capacitance 22. Therefore, the influence of the variation in parasitic capacitances of the blocking horizontal signal lines 9-1 and 9-2 is suppressed. Herein, reference symbol CT denotes a value of the holding capacitance 7 and reference symbol CF denotes a value of the feed-back capacitance 22 and, then, the output voltage VOUT of the capacitance feed-back amplifier 20 is expressed by the following formula.

$$VOUT = (CT/CF) \cdot VREF$$

On the other hand, upon using the voltage reading amplifier, the variation in parasitic capacitances between the blocking horizontal signal lines 9-1 and 9-2 causes the variation in potentials on the common horizontal signal line 11. Further, the outputs of the voltage reading amplifier which amplifies the potentials can be varied.

Figure 4:
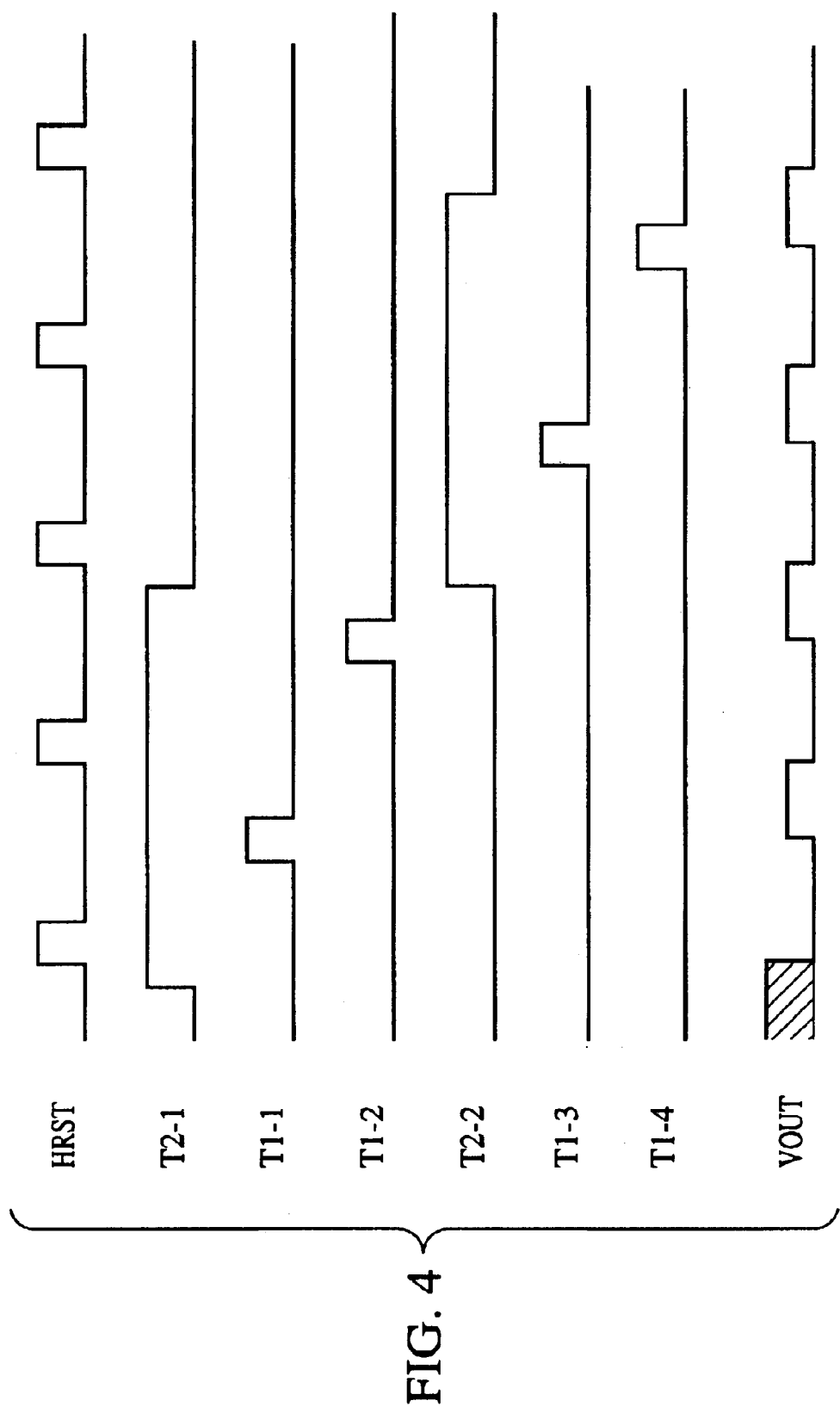
FIG. 4 is a timing chart showing one example of timings for controlling a first switch and a second switch.

Next, a description is given of the operation for controlling the first switch 8 and the second switch 10 after transferring an output signal from the sensor cell 2 of the row selected by the horizontal scanning circuit 4 with reference to FIG. 4.

According to the first embodiment, the control circuit 14 generates a reset signal HRST for resetting the common horizontal signal line 11 and the capacitance feed-back amplifier 20. The horizontal scanning circuit 13 generates first transfer control signals T1-1 to T1-4 for controlling the first switches 8-1 to 8-4 and second transfer control signals T2-1 and T2-2 for controlling the second switches 10-1 and 10-2. The horizontal scanning circuit 13 is controlled by a control signal HCON which is generated by the control circuit 14.

First, the second transfer control signal T2-1 is set to the active level (H level) and the second switch 10-1 for a first block is turned on. Subsequently, the transistor for reset 12 is turned on for a period of an H pulse of the reset signal HRST as a pulse signal having a predetermined period. Consequently, both the common horizontal signal line 11 and the blocking horizontal signal line 9-1 are reset and further the capacitance feed-back amplifier 20 is reset.

Next, the first transfer signal T1-1 is set to the active level (H level) only for a predetermined term, and the first switch 8-1 for a first column is turned on. Consequently, the charges held in the holding capacitance 7-1 of the first column are distributed to the blocking horizontal signal line 9-1 and the common horizontal signal line 11 and are read as the voltage signals VOUT by the capacitance feed-back amplifier 20.

Next, the transistor for reset 12 is turned on for a period of the H pulse of the reset signal HRST. Thus, the common horizontal signal line 11 and the blocking horizontal signal line 9-1 are reset and the capacitance feed-back amplifier 20 is reset.

Next, the first transfer signal T1-2 is set to the active level (H level) only for a predetermined term and the first switch 8-2 for a second column is turned on. Thus, the charges held in the holding capacitance 7-2 for the second column are distributed to the blocking horizontal signal line 9-1 and the common horizontal signal line 11 and are read as the voltage signals VOUT by the capacitance feed-back amplifier 20.

Next, the second transfer signal T2-1 is set to an inactive level (L level) and the second switch 10-1 for the first block is turned off. Consequently, the operation for reading the first block ends.

Subsequently, the second transfer signal T2-2 is set to the active level (H level) and the second switch 10-2 for the second block is turned on. After that, the transistor for reset 12 is turned on for a period of the H pulse of the reset signal HRST. Thus, both the common horizontal signal line 11 and the blocking horizontal signal line 9-1 are reset and the capacitance feed-back amplifier 20 is reset.

Next, the first transfer signal T1-3 is set to the active level (H level) only for a predetermined term and the first switch 8-3 for a third column is turned on. Thus, the charges held in the holding capacitance 7-3 for the third column are distributed to the blocking horizontal signal line 9-2 and the common horizontal signal line 11 and are read as the voltage signals VOUT by the capacitance feed-back amplifier 20.

Subsequently, the transistor for reset 12 is turned on for a period of the H pulse of the reset signal HRST.

Consequently, both the common horizontal signal line 11 and the blocking horizontal signal line 9-2 are reset and the capacitance feed-back amplifier 20 is reset.

Subsequently, the first transfer signal T1-4 is set to the active level (H level) only for a predetermined term and the first switch 8-4 for a fourth column is turned on. Thus, the charges held in the holding capacitance 7-4 for the fourth column are distributed to the blocking horizontal signal line 9-2 and the common horizontal signal line 11 and are read as the voltage signals VOUT by the capacitance feed-back amplifier 20.

The second transfer signal T2-2 is set to the inactive level (L level) and the second switch 10-2 for the second block is turned off. Thus, the operation for reading the second block ends.

The above description corresponds to the operation for reading one row. After this operation, the control circuit 14 sets the reset signal VRST and the transfer signal TRAN to the active level (H level), thereby resetting the vertical signal line 5 and the holding capacitance 7. Then, the vertical scanning circuit 4 sets the selecting signal line 3 of a next row to the active level (H level) and the output signal of the sensor cell 2 of the next row is transferred to the holding capacitance 7. After that, the reading operation of the corresponding row is executed in accordance with the sequence shown in FIG. 4.

According to the first embodiment, the solid image pick-up apparatus has an adding function for adding the output signals of the sensor cells 2 of the rows for blocks and outputting the added output signals. That is, the solid image pick-up apparatus has the adding function for distributing the charges corresponding to the total charges held in the holding capacitances 7-1 and 7-2 (or 7-3 and 7-4) which share the blocking horizontal signal line 9-1 (or 9-2), and for outputting the total of the output signals from the sensor cells 2-x1 and 2-x2 (or 2-x3 and 2-x4) (where x is any of 1 to 4), that is, the total of values of pixels in the row direction in the blocks.

Figure 5:
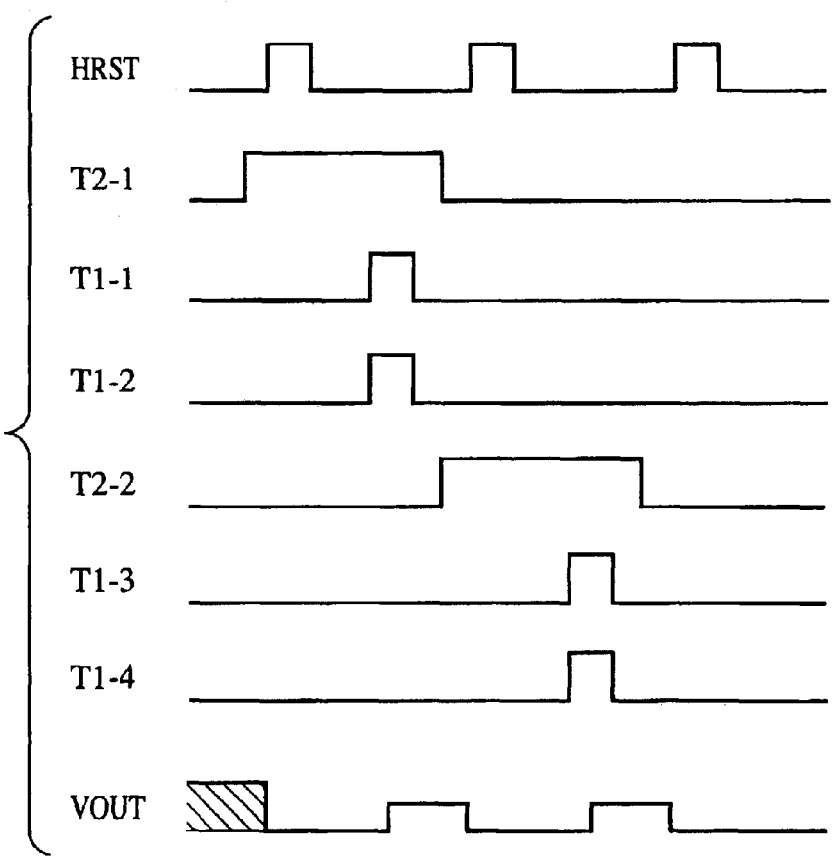
FIG. 5 is a timing chart showing another example of timings for controlling the first switch and the second switch upon adding operation.

FIG. 5 is a timing chart showing timings of the first transfer control signal, the second transfer control signal, and the like for realizing the adding function. The horizontal scanning circuit 13 receives an instruction for the adding operation by the control signal HCON generated by the control circuit 14, thereby controlling the first transfer control signals T1-1 to T1-4 and the second transfer control signal T2-1 and T2-2 as shown in FIG. 5. Thus, the adding operation is controlled. That is, the first transfer control signals T1-1 and T1-2 (or T1-3 and T1-4) are set to the active level and the first switches 8-1 and 8-2 (or 8-3 and 8-4) are turned on, thereby realizing the adding operation. Thus, the adding operation can be executed fast without providing any calculators for addition.

The total is divided by the number of columns of the block (here, 2 according to the first embodiment), thereby obtaining an average of pixel values of the rows in the block. The function for calculating the average will be described later with an applied example.

Figure 6:
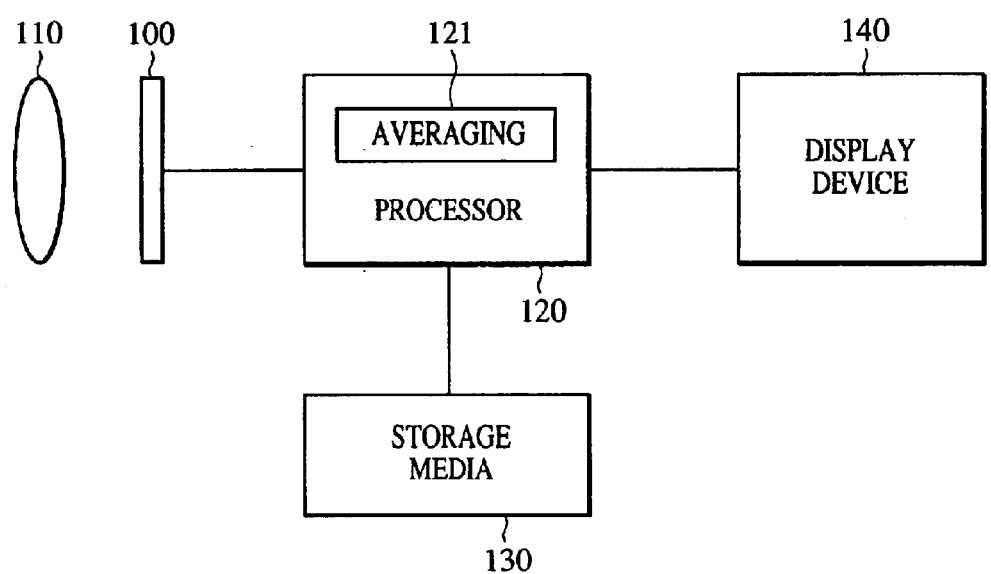
FIG. 6 is a diagram schematically showing the structure of a camera including the solid image pick-up apparatus shown in FIG. 2.

FIG. 6 is a diagram showing the schematic structure of a camera including the solid image pick-up device shown in FIG. 2. Incidentally, this camera is generally called a digital camera, as a different concept of a film camera (using silver salt), and includes a still camera, a movie camera, a camera having the above-mentioned functions thereof, and the like. Alternatively, this camera may be incorporated as a part in an information processing apparatus such as a personal computer or a mobile terminal.

A subject image is focused onto the solid image pick-up apparatus 100 by a fixed-type or exchange-type lens unit 110. An output from the solid image pick-up apparatus 100 is supplied to a processor (image processing unit) 120. A signal supplied to the processor 120 may be an analog signal (e.g., the voltage signal VOUT or a signal obtained by processing the voltage signal VOUT), or a digital signal A/D converted from the analog signal.

The processor 120 subjects the signal supplied from the solid image pick-up apparatus 100 to image processing, supplies the resultant signal to a display device 140, and records the signal to a storage media 130. The display device 140 functions as an information providing unit for displaying various information for photographing and reading the signal and as a view finder.

The camera typically includes an exposure adjusting function, a focus adjusting function, and the like. These functions can be designed based on a well-known technology and therefore a detailed description thereof is omitted.

The processor 120 comprises an averaging processing unit 121 for calculating an average of a predetermined number of pixels by using the above-mentioned adding function (for adding the values of the pixels in the row direction by a block unit) in the solid image pick-up apparatus 100.

Figure 7A:
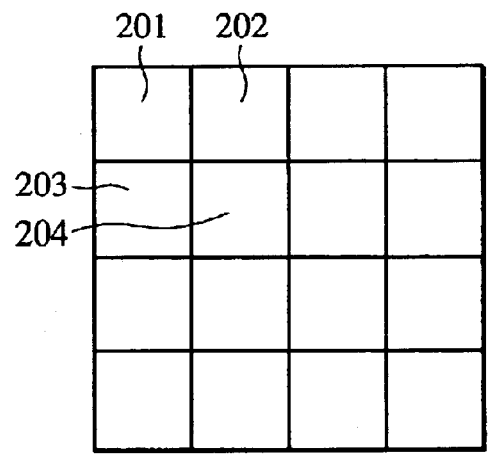
FIGS. 7A to 7C are diagrams for explaining a high-resolution mode and a low-resolution mode.

The camera realizes a low-resolution mode by using the function of the averaging processing unit 121. This operation of the camera will be described with reference to FIGS. 7A to 7C. FIG. 7A conceptually shows an image picked up in a high-resolution mode. As a brief example, the solid image pick-up apparatus 100 has pixels (sensor cells) including four rows and four columns similarly to the example shown in FIG. 2. Referring to FIG. 7A, the image having the pixels of the four rows and the four columns is picked up in the high-resolution mode.

Figure 7B:
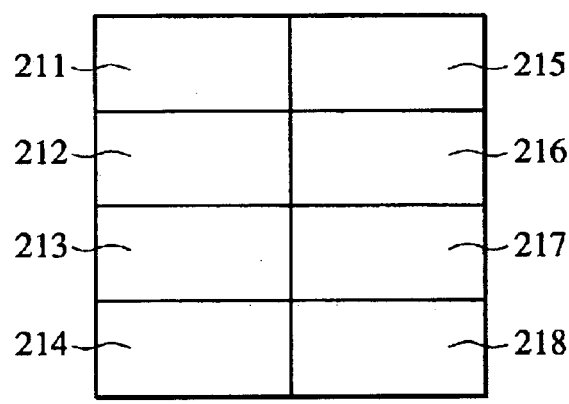
Figure 7C:
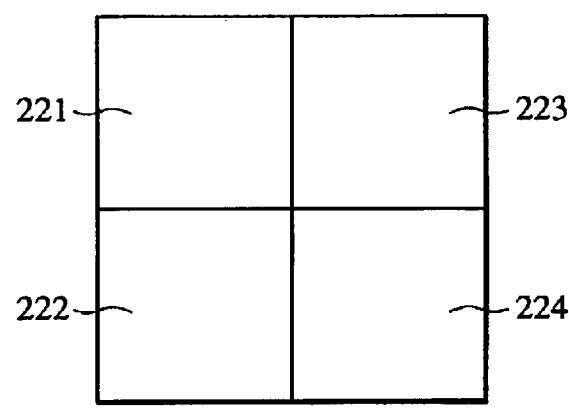

On the other hand, as mentioned above with reference to FIG. 5, the values of the pixels in the row direction are added by the block unit. Therefore, an image schematically shown in FIG. 7B is outputted from the solid image pick-up apparatus 100. Referring to FIGS. 7A and 7B, the same subject image is picked up under the same condition, then, a pixel 211 has a pixel value obtained by adding a pixel 201 and a pixel 202, and a pixel 212 has a pixel value obtained by adding a pixel 203 and a pixel 204.

The averaging processing unit 121 calculates the average of the pixel values of four pixels (at the positions of the pixels 201 to 204) based on the pixel values of the pixels 211 and 212.

In place of the above-mentioned processing, only a value (adding values of the two pixels) of the pixel 211, 213, 215, or 217 is read from the solid image pick-up apparatus 100. The value is divided by 2 and the resultant value is set to value of the pixel 221, 222, 223, or 224.

The low-resolution mode is advantageous as a mode for picking up the image having the low resolution (small number of pixels) as an image to be recorded in the storage media 130. Further, the low-resolution mode is advantageous to obtain an image for the view finder to be supplied to the display device 140.

As mentioned above, the averaging processing or the low-resolution processing is executed fast with simple calculation by using the adding function of the solid image pick-up apparatus 100.

In addition, a description is given of a method for directly reading the averaged signal as another method of the above-mentioned one. According to the above-mentioned method, the added signal is processed by both the averaging processing block and the signal processing block.

However, according to the other method, a plurality of second switches are set to OFF every block having the predetermined number and a plurality of first switches are set to ON. Further, signal charges are averaged between the predetermined number of holding capacitances which share the blocking signal line.

After executing the block averaging processing, the signal of the holding capacitance which holds the averaged signal every block is sequentially read. In this case, the signal may be read as information from the one holding capacitance every block. Therefore, skip scanning is substantially performed (the signals are read every several columns).

Similar to the addition, a signal reading time per frame is reduced corresponding to the blocking signals. Specifically, the signal reading time per frame is reduced to ⅛ by sharing eight columns per frame.

Advantageously, the processing time of the image processing is reduced by averaging processing in the sensor cell. The image including many low-luminances is preferable for the output as the addition result because the signal gain is improved. On the contrary, the image including many high-luminances requiring a dynamic range is not preferable for the output as the addition result because the output is promptly saturated.

On the other hand, the reading gain in the case of the output as the averaging result is the same as that of normal photographing. The image including many high-luminances requiring the dynamic range is preferable for the output as the averaging result.

In the above example, all the pixels in the solid image pick-up apparatus 100 are used as valid pixels. However, the following is given of another example using a part of an area having the alignment of the sensor cells (sensor cell array area) as an optical black unit, as a practical application example according to a modification of the first embodiment.

Figure 8:
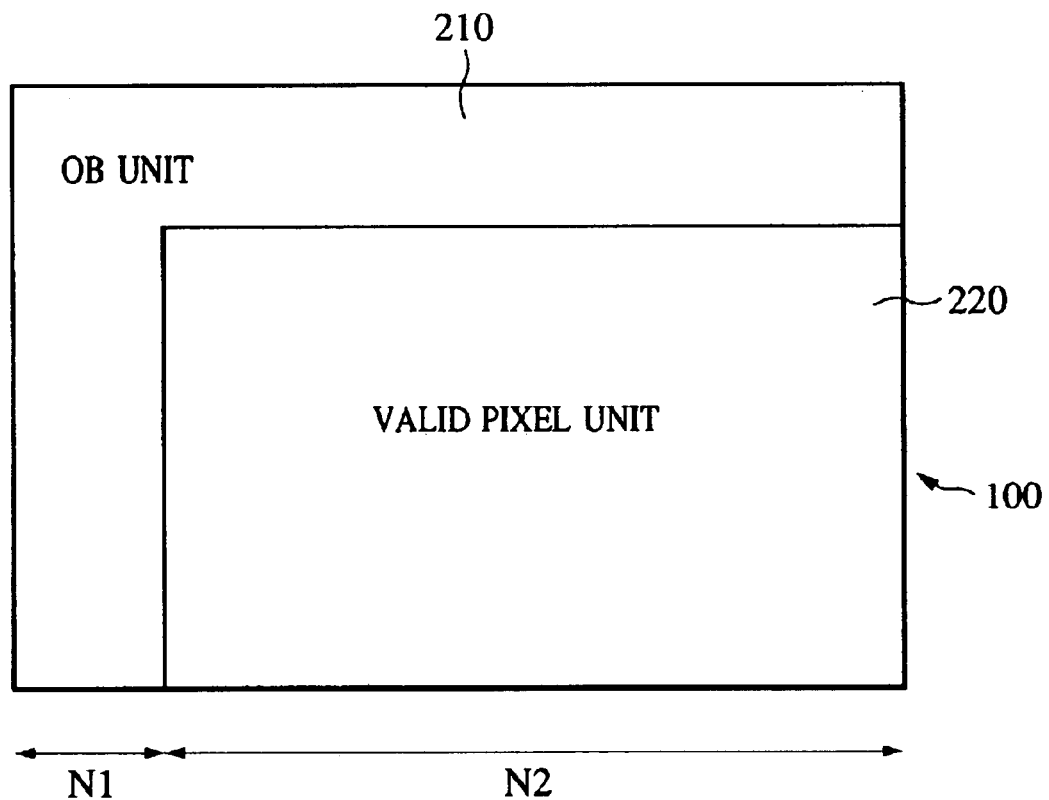
FIG. 8 is a diagram conceptually showing the solid image pick-up apparatus having an optical black unit according to a modification of the first embodiment.

In an example shown in FIG. 8, the sensor cell array of the solid image pick-up apparatus 100 includes an optical black (hereinafter, referred to as an OB) unit 210 for detecting an optical black level and a valid pixel unit 220. Preferably, a common factor of a number N1 of columns of the OB unit 210 is set to the block unit (i.e., the number of columns for each block). Further, preferably, a number N2 of columns of the valid pixel unit 220 is set to a multiple of the number of columns of the OB unit 210 (in this case, the common factor of the number N2 of columns of the valid pixel unit 220 matches the block unit).

With the above structure, the block does not include the boundary between the OB unit 210 and valid pixel unit 220. Therefore, the image processing by the block unit becomes easy and, for example, processing in the processor 120 is simplified.

Figure 9:
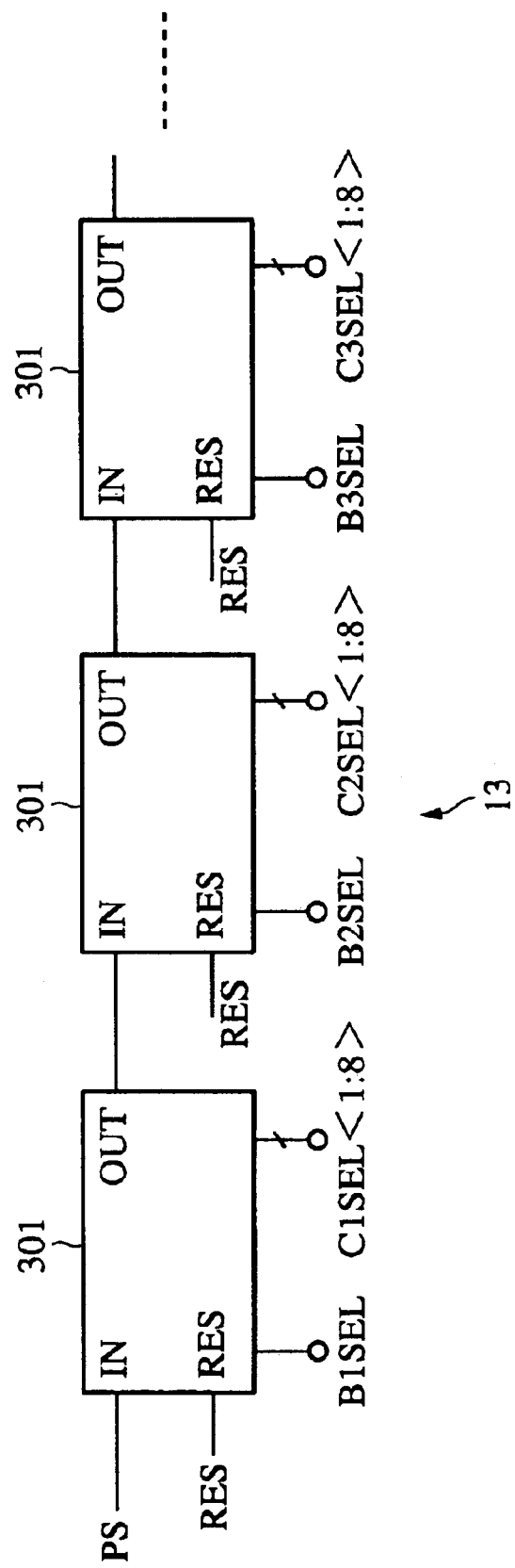
FIG. 9 is a diagram showing one example of the structure of a horizontal scanning circuit.

Next, a description is given of an example of the structure of the horizontal scanning circuit 13. FIG. 9 is a diagram showing the example of the structure of the horizontal scanning circuit 13. Incidentally, one block contains eight blocks with a practical example.

Referring to FIG. 9, the horizontal scanning circuit 13 is formed by serially connecting shift registers 301 each of which corresponds to one block (of the array of the sensor cell 2). A predetermined pulse signal PS is inputted to the initial shift register 301, thereby starting shifting operation in response to the input of the signal PS. A predetermined pulse signal is outputted from an OUT terminal and is inputted to the next shift register 301. The shift registers 301 output signals BxSEL (where x is 1, 2, 3, . . . ) for selecting the corresponding block. The signal BxSEL corresponds to the transfer control signal T2-1 or T2-2 for selecting the second switch 10-1 or 10-2 as shown in FIG. 2. Further, the shift registers 301 output signals CxSEL<1:8> (where x is 1, 2, 3 . . . ) for selecting the column in the corresponding block. The signal CxSEL<1:8> corresponds to the transfer control signal T1-1 or T1-2 for selecting the first switch 8-1 or 8-2 as shown in FIG. 2.

Figure 10:
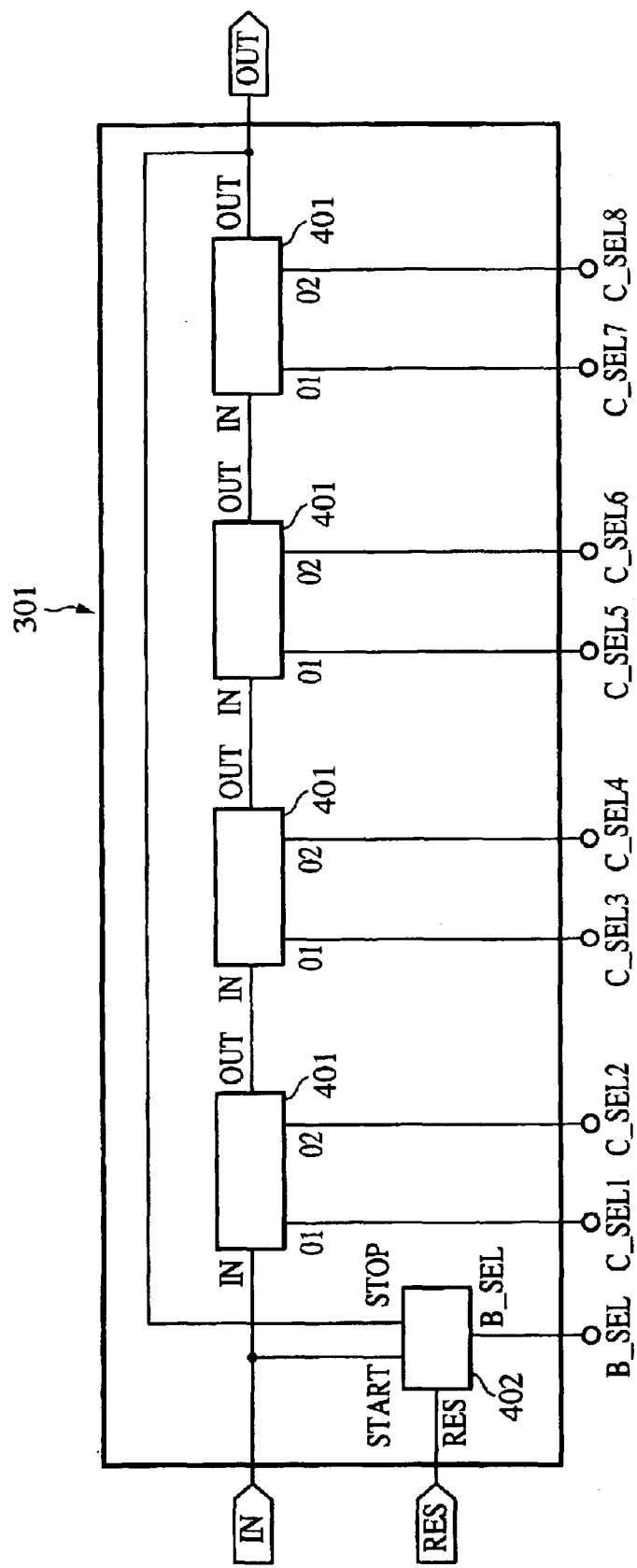
FIG. 10 is a diagram showing another example of the structure of the horizontal scanning circuit.

FIG. 10 is a diagram showing an example of the structure of the shift register 301. The shift register 301 is formed by serially connecting four sets of 2-bit shift registers 401. The four sets of the 2-bit shift registers 401 output signals C_SEL1 to C_SEL8 corresponding to the signals CxSEL<1:8>. Further, the shift register 301 comprises a block control circuit 402 for generating a signal B_SEL corresponding to a transfer control signal BxSEL for selecting the corresponding block (second switch).

Figure 11:
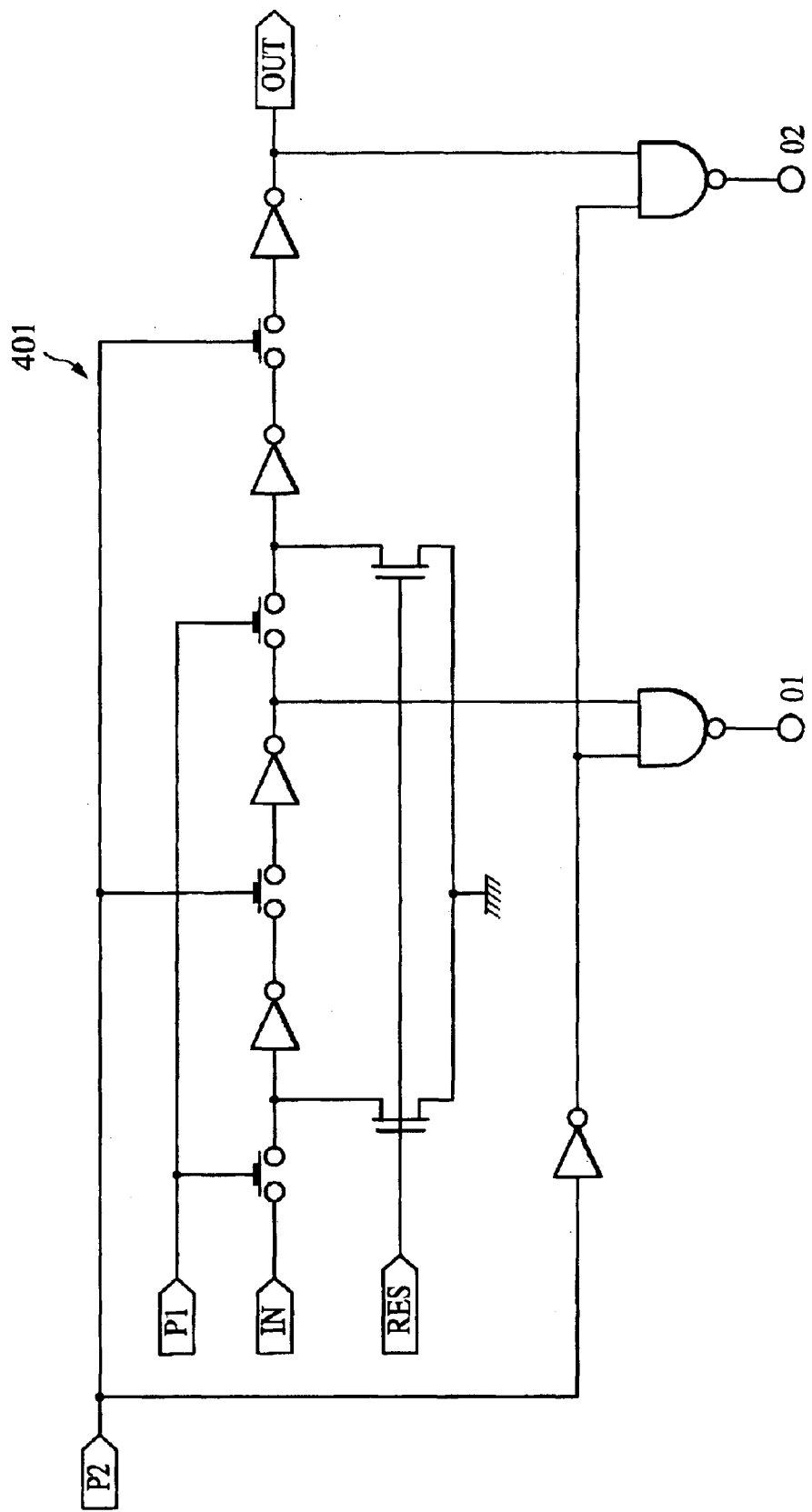
FIG. 11 is a diagram showing another example of the structure of the horizontal scanning circuit.

The block control circuit 402 activates the signal B_SEL to the H level synchronously with the activation of an input signal to the initial 2-bit shift register 401, and inactivates the signal B_SEL to the L level synchronously with an output signal of the final 2-bit shift register 401. FIG. 11 is a diagram showing an example of the structure of the 2-bit shift register 401.

Figure 12:
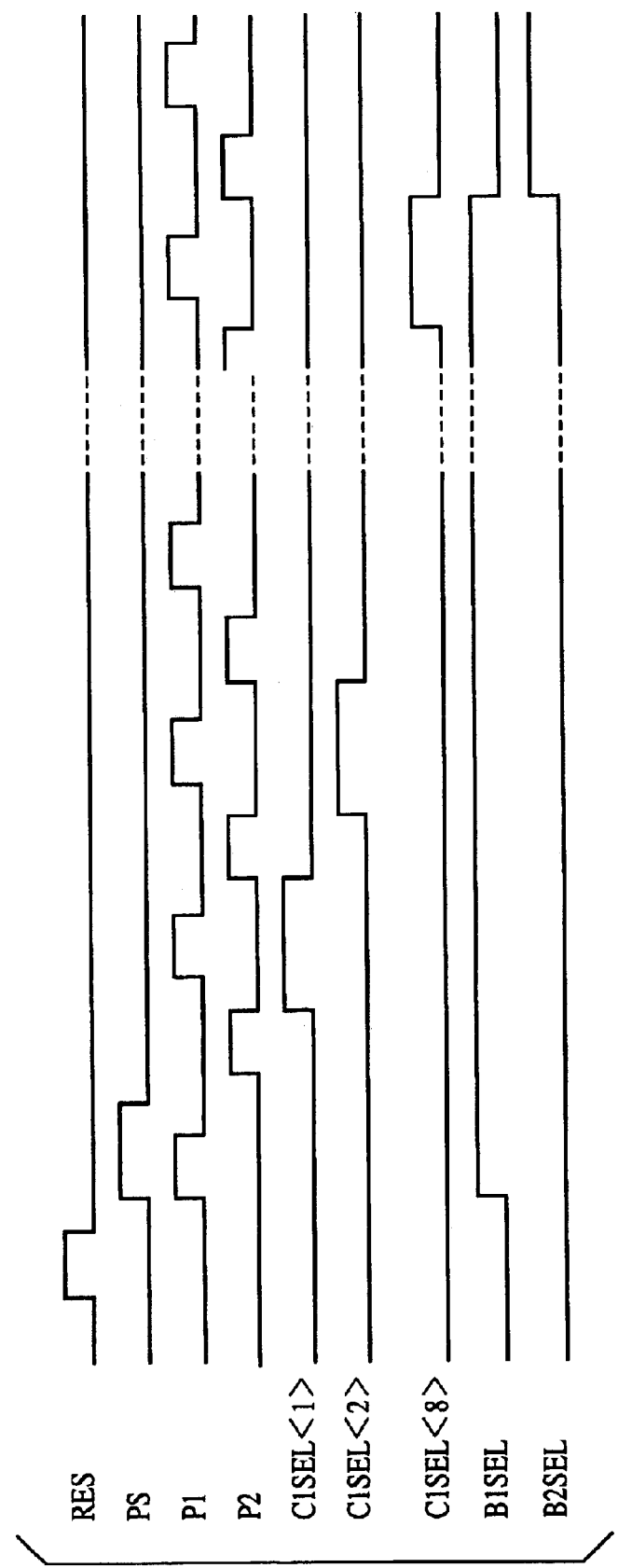
FIG. 12 is a timing chart of the horizontal scanning circuit shown in FIGS. 9 to 11.

FIG. 12 is a timing chart showing the operation of the horizontal scanning circuit 13 shown in FIGS. 9 to 11.

In the solid image pick-up apparatus 100, the blocking horizontal signal lines 9-1 and 9-2 are connected to the common horizontal signal line 11 via the second switches 10-1 and 10-2 as one example. This structure is considered as one-stage blocking. The present invention can be applied to two-or-more-stage blocking.

Figure 13:
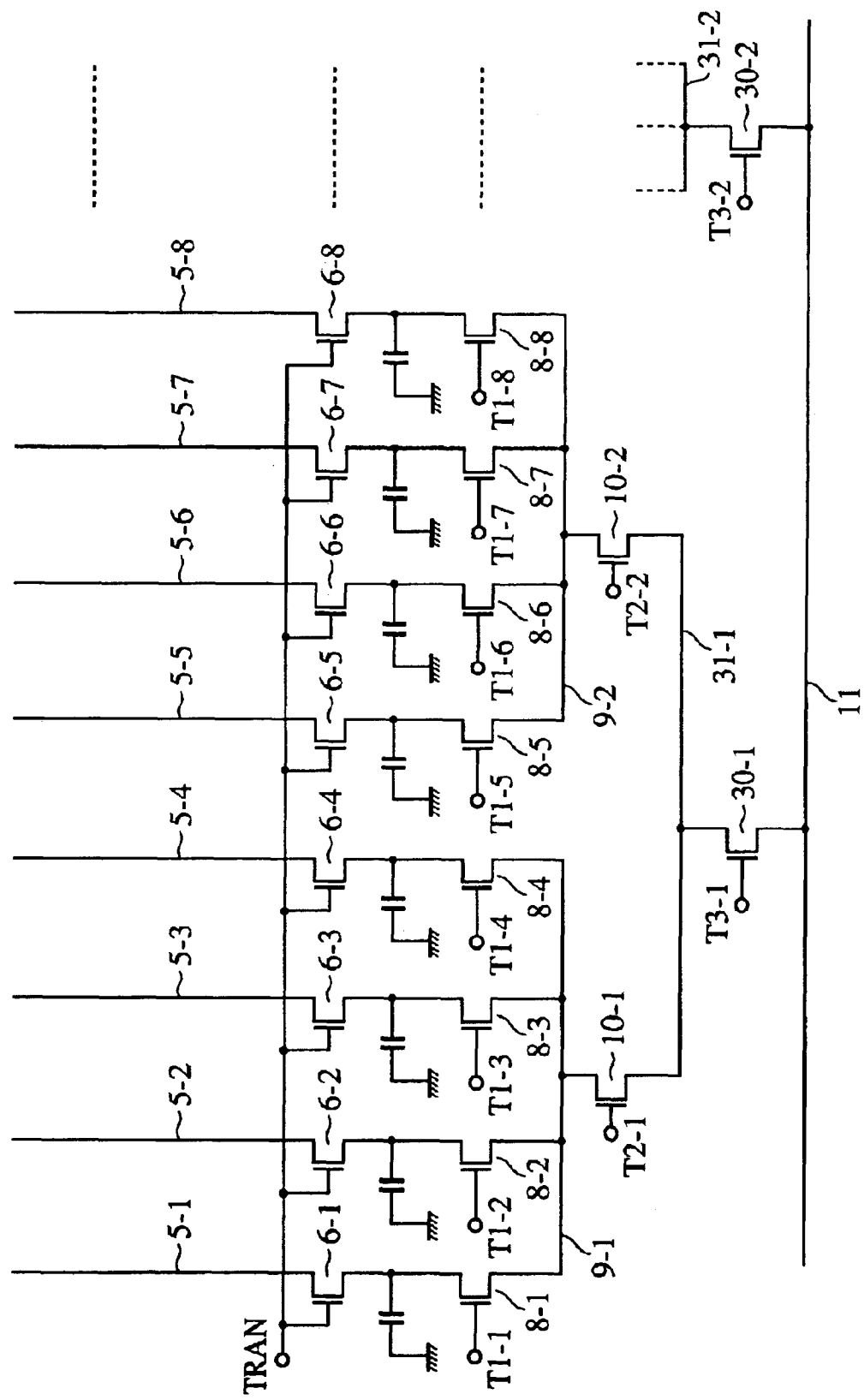
FIG. 13 is a diagram showing the concept of blocking in multi-stage.

FIG. 13 is a diagram showing the structure of a solid image pick-up apparatus to which two-stage blocking is applied in the present invention. Incidentally, the photoelectric converting device 2, the vertical scanning circuit 4, the horizontal scanning circuit 13, the amplifier 20, the control circuit 14, and the like are omitted in FIG. 13.

Referring to FIG. 13, first-stage blocking is performed based on a predetermined number (herein, four) of columns as a unit by using first-blocking horizontal signal lines 9-1, 9-2, . . . and first switches 8-1, 8-2 . . . Further, second-stage blocking is performed based on a predetermined number (herein, two) of the first blocking horizontal signal lines 9-1, 9-2, . . . as a unit by using second-blocking horizontal signal lines 31-1 and 31-2 and the second. switches 10-1 and 10-2. Furthermore, the second blocking horizontal signal lines 31-1, 31-2, . . . are connected to the common horizontal signal line 11 via third switches 30-1, 30-2, . . . .

In addition, three-or-more stage blocking may be performed in accordance with the above-stated technological spirit of the present invention.

Advantageously, the parasitic capacitances on the common horizontal signal line 11 can be reduced by the above-mentioned blocking at multiple stages.

Figure 14:
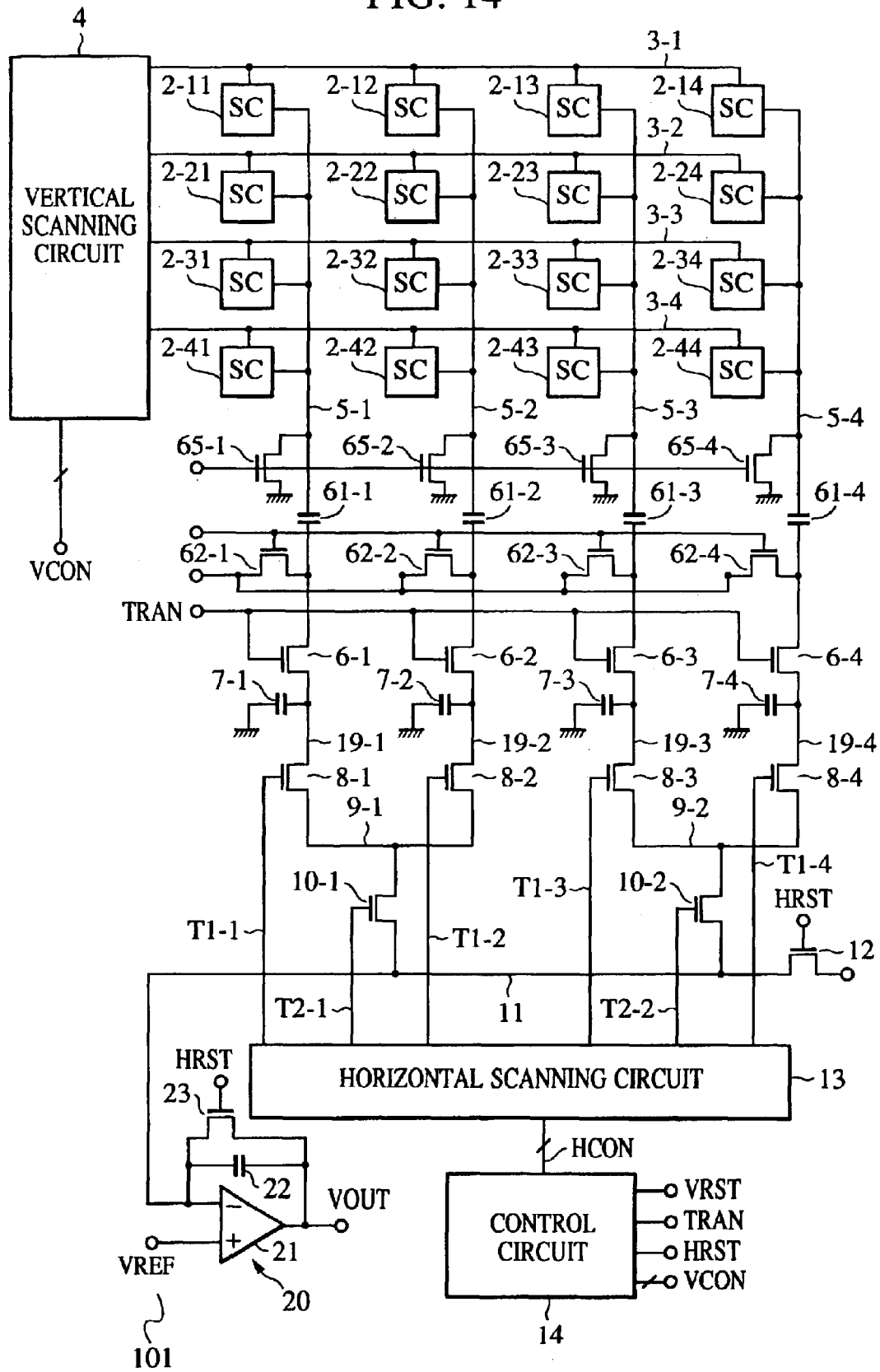
FIG. 14 is a block diagram showing the structure of a solid image pick-up apparatus according to a second embodiment of the present invention.

Further, the present invention is not limited to the solid image pick-up apparatus shown in FIG. 2 and can be applied to a solid image pick-up apparatus with the structure as shown in FIG. 14 according to a second embodiment of the present invention.

Referring to FIG. 14, the solid image pick-up apparatus 101 is formed by arranging in front of the transfer transistors 6 (6-1 to 6-4) of the solid image pick-up apparatus in FIG. 2, a clamping circuit (comprising capacitances 61 (61-1 to 61-4) serially connected to the vertical signal lines 5 and switch transistors 62 (62-1 to 62-4) of which first terminals connected in parallel between the capacitances 61 and the transfer transistors 6 are connected to predetermined potentials). One pixel has the structure shown in FIG. 15.

Figure 15:
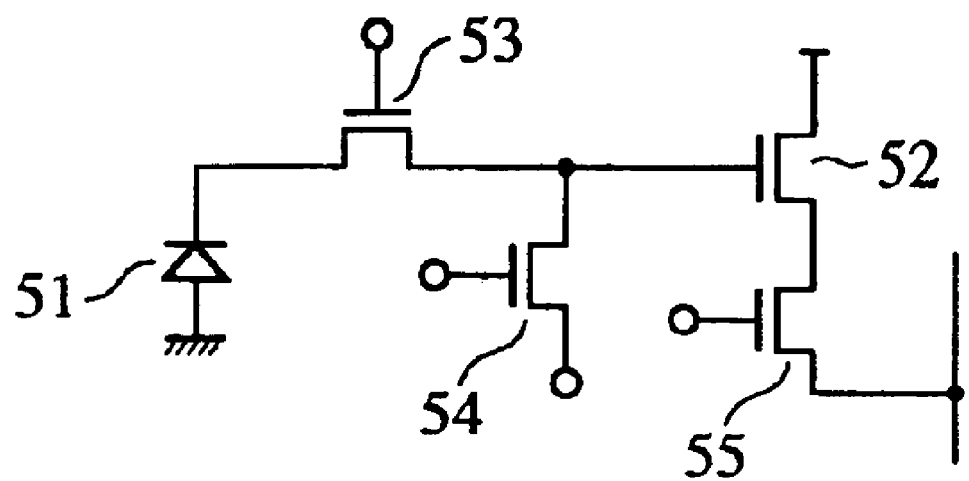
FIG. 15 is a diagram showing an example of the structure of a sensor cell.

Referring to FIG. 15, reference numeral 51 denotes a photodiode, reference numeral 52 denotes an amplifying transistor as amplifying means for amplifying charges of a gate and outputting the amplified charges to the vertical signal line 5. Reference numeral 53 denotes a transfer transistor as transfer means for transferring the charges generated by the photodiode 51 to the gate of the amplifying transistor 52. Reference numeral 54 denotes a reset transistor as reset means for resetting the gate of the amplifying transistor 52. Reference numeral 55 denotes a selecting transistor as selecting means for selecting the pixel which outputs the signal. Referring back to FIG. 14, reference numeral 65 denotes a load transistor as load means comprising the amplifying transistor 52 mentioned above in FIG. 15 and a source follower circuit.

Next, a description is give of the operation of the solid image pick-up apparatus with reference to FIG. 14. First, the clamping circuit clamps the reset signal which is generated by resetting the gate of the amplifying transistor 52. After that, the transfer transistor 53 is turned on, then the charges of the photodiode are transferred to the gate of the amplifying transistor 52, and a photoelectrically converting signal outputted from the amplifying transistor 52 is outputted to the clamping circuit.

By the above-mentioned operation, the clamping circuit transmits a signal obtained by removing a fixed pattern noise and a random noise which are generated every pixel and the obtained signal is held in the capacitance 7.

Others are the same as those of the solid image pick-up apparatus shown in FIG. 2, excluding the above-mentioned structure and operation.

The fixed pattern noise and the random noise which are generated every pixel can be suppressed by arranging the clamping circuit.

Figure 16:
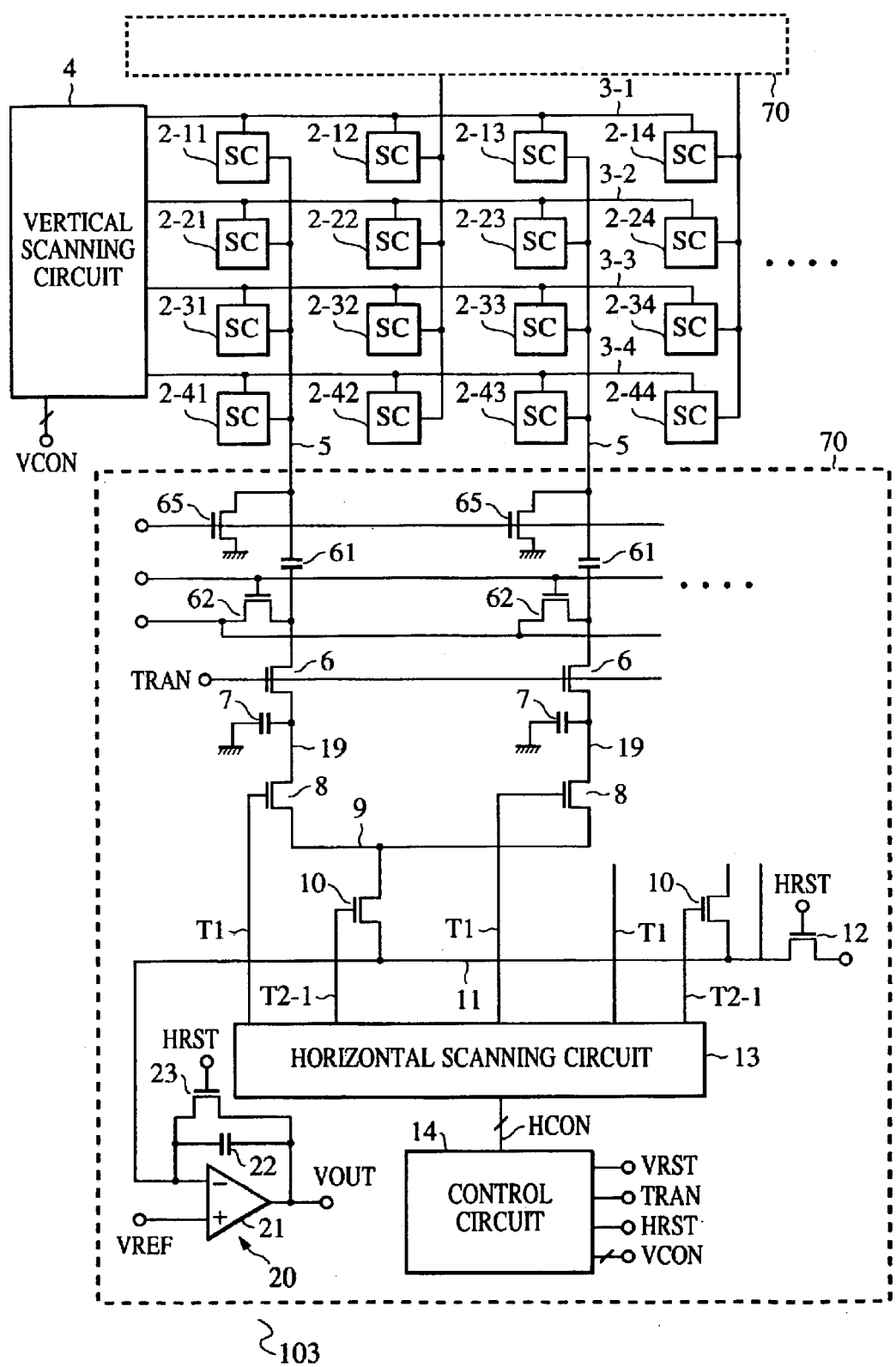
FIG. 16 is a diagram showing the structure of a solid image pick-up apparatus according to a third embodiment.

Further, the present invention can be applied to the circuitry structure as shown in FIG. 16 according to a third embodiment. Referring to FIG. 16, the signals are outputted to horizontal signal lines different for different columns in the vertical direction. A portion 70 surrounded by a broken line has the above-mentioned structure as shown in FIG. 14. The operation is the same as that of the solid image pick-up apparatus shown in FIG. 14.

With the circuitry structure of the solid image pick-up apparatus 102 as shown in FIG. 16, the reduction in reading speed is prevented by two portions 10 even when the number of pixels is large.

As mentioned above, the parasitic capacitance of the common signal line can be reduced without increasing the load to be driven by the sensor cell including the photoelectrically converting device, and/or the reading route is easily similar and the parasitic capacitance of the common signal line can be reduced.

Accordingly, the image signal is read with a high reading gain or a high S/N ratio.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A solid image pick-up apparatus having a plurality of sensor cells, each of the sensor cells having a photoelectric converting device, said solid image pick-up apparatus comprising:

a plurality of holding capacitances for holding signals from the plurality of sensor cells;

a plurality of first switches for transferring signals from said plurality of holding capacitances;

a plurality of blocking areas for connecting outputs of said plurality of first switches, each blocking area connecting the outputs of at least two of said first switches;

a common signal line; and a plurality of second switches for transferring signals from the plurality of blocking areas to said common signal line.

2. A solid image pick-up apparatus according to claim 1, further comprising:

a capacitance feed-back amplifier for amplifying a signal on said common signal line.

3. A solid image pick-up apparatus according to claim 2, wherein said capacitance feed-back amplifier comprises:

a difference amplifier whose input terminal is connected to said common signal line; and a feed-back capacitance connected between the input terminal of said difference amplifier and an output terminal thereof.

4. A solid image pick-up apparatus to claim 1, wherein the alignment of said plurality of sensor cells includes a valid pixel unit and an optical black unit, and said valid pixel unit and said optical black unit belong to different blocks of sensor cells, respectively.

5. A solid image pick-up apparatus according to claim 4, wherein the predetermined number is a common factor of the number of the optical black units in the direction of the alignment of said plurality of holding capacitances.

6. A solid image pick-up apparatus according to claim 1, further comprising:

a control circuit for controlling said plurality of first switches so that the signals corresponding to the total of the signals having a predetermined number of holding capacitances sharing said blocking area are transferred to said common signal line, every block of sensor cells having the predetermined number of sensor cells as a unit.

7. A solid image pick-up apparatus according to claim 1, wherein said plurality of sensor cells are aligned two-dimensionally in the horizontal direction and in the vertical direction, and said solid image pick-up apparatus further comprises a control circuit for executing a control operation so as to obtain signals corresponding to the total of signals read from the predetermined number of sensor cells, every block having a predetermined number of columns as a unit for each row of the alignment of said plurality of sensor cells.

8. A solid image pick-up apparatus according to claim 1, further comprising:

a scanning circuit for controlling said plurality of first switches and said plurality of second switches so as to read the signals from the sensor cells in predetermined order.

9. A solid image pick-up apparatus according to claim 8, wherein said scanning circuit is structured in that an initial one of said plurality of first switches connected to the same blocking area and said second switch are turned on by a common pulse, and said second switch is turned off at a timing for turning on a final one of said plurality of first switches.

10. A solid image pick-up apparatus according to claim 1, further comprising:

a driving circuit for controlling reset operation and operation for reading the signal so that the signal of the sensor cell is read by opening said first switch of the sensor cell after opening said second switch connected to said blocking area of the sensor cell from which the signal is read and resetting said blocking area and said common signal line.

11. A solid image pick-up apparatus according to claim 1, further comprising:

a clamping circuit for clamping the signal from said sensor cell between said first switch and said sensor cell.

12. A solid image pick-up apparatus according to claim 1, further comprising:

a control circuit for controlling said plurality of first switches and said plurality of second switches so that said plurality of seconds switches are turned off for each of the predetermined number of blocks as a unit, said plurality of first switches are turned on, signal charges are averaged among the predetermined number of holding capacitances which share said blocking area, and the signals having the averaged charge of the holding capacitances are read sequentially, every block, or every several-bits.

13. A solid image pick-up apparatus according to claim 1, wherein said plurality of sensor cells are aligned two-dimensionally in the horizontal direction and in the vertical direction, and said solid image pick-up apparatus further comprises:

a control circuit for executing control operation so as to obtain a signal corresponding to an average of the signals from a predetermined number of sensor cells, every block having the predetermined number of columns as a unit for each row the alignment of said plurality of sensor cells.

14. A camera comprising:

a camera body;

a solid image pick-up apparatus having a plurality of sensor cells, each of the sensor cells having a photo-electric converting device, said solid image pick-up apparatus comprising:

a plurality of holding capacitances for holding signals from the plurality of sensor cells;

a plurality of first switches for transferring signals from said plurality of holding capacitances;

a plurality of blocking areas for connecting outputs of said plurality of first switches, each blocking area connecting the outputs of at least two of said first switches;

a common signal line;

a plurality of second switches for transferring signals from the plurality of blocking areas to said common signal line; and a processor for processing an image picked-up by said solid image pick-up apparatus.

15. An information processing apparatus comprising:

a solid image pick-up apparatus having a plurality of sensor cells, each of the sensor cells having a photo-electric converting device, said solid image pick-up apparatus comprising:

a plurality of holding capacitances for holding signals from the plurality of sensor cells;

a plurality of first switches for transferring signals from said plurality of holding capacitances;

a plurality of blocking areas for connecting outputs of said plurality of first switches, each blocking area connecting the outputs of at least two of said first switches;

a common signal line;

a plurality of second switches for transferring signals from the plurality of blocking areas to said common signal line; and a processor for processing an image picked-up by said solid image pick-up apparatus.

* * * * *

UNITED STATES PATENT AND TRADEMARK OFFICE
CERTIFICATE OF CORRECTION

PATENT NO.    : 6,847,026 B2                                        Page 1 of 1
DATED         : January 25, 2005
INVENTOR(S)   : Toru Koizumi et al.

It is certified that error appears in the above-identified patent and that said Letters Patent is hereby corrected as shown below:

Column 1,
Line 18, "it" should be deleted.
Line 52, "to" should be deleted.

Column 2,
Line 3, "photoelectri-" should read -- photoelectric --.
Line 4, "cally" should be deleted.
Line 5, "photoelectrically" should read -- photoelectric --.
Line 16, "cells" should read -- cells, --
Line 22, "switches" should read -- switches, --.

Column 3,
Line 20, "number" should rad -- numbers --.

Column 8,
Line 67, "OFF" should read -- OFF, --.

Column 9,
Line 1, "number" should read -- number, --.

Column 11,
Line 14, "give" should read -- given --.
Line 48, "trically" should read -- tric --.

Signed and Sealed this

Seventh Day of June, 2005

JON W. DUDAS
*Director of the United States Patent and Trademark Office*